(12) United States Patent
Gross

(10) Patent No.: US 7,220,963 B2
(45) Date of Patent: May 22, 2007

(54) LIGHT WEIGHT PORTABLE SCANNING ELECTRON MICROSCOPE

(75) Inventor: Harald Gross, 3158 Cardenas Ter. Apt. 355, Fremont, CA (US) 94536

(73) Assignee: Harald Gross, Dresden (DE)

( * ) Notice: Subject to any disclaimer, the term of this patent is extended or adjusted under 35 U.S.C. 154(b) by 0 days.

(21) Appl. No.: 11/108,275

(22) Filed: Apr. 18, 2005

(65) Prior Publication Data

US 2005/0178966 A1    Aug. 18, 2005

Related U.S. Application Data

(63) Continuation of application No. 10/453,117, filed on Jun. 2, 2003, now Pat. No. 6,897,443.

(51) Int. Cl.
*H01J 37/28* (2006.01)

(52) U.S. Cl. ................................ 250/310; 250/44.11

(58) Field of Classification Search ...................... None
See application file for complete search history.

(56) References Cited

U.S. PATENT DOCUMENTS

| | | | | |
|---|---|---|---|---|
| 4,241,259 A | * | 12/1980 | Feuerbaum et al. ... | 250/441.11 |
| 4,516,026 A | * | 5/1985 | Jouffrey et al. ........... | 250/310 |
| 4,587,431 A | * | 5/1986 | Uemura .................. | 250/442.11 |
| 5,254,856 A | * | 10/1993 | Matsui et al. ............... | 250/310 |
| 5,399,860 A | * | 3/1995 | Miyoshi et al. ............. | 250/310 |
| 5,557,105 A | * | 9/1996 | Honjo et al. ................ | 250/310 |
| 6,559,457 B1 | * | 5/2003 | Phan et al. ................. | 250/310 |
| 6,897,443 B2 | * | 5/2005 | Gross ......................... | 250/310 |
| 7,064,325 B2 | * | 6/2006 | Buijsse et al. .............. | 250/310 |
| 7,067,820 B2 | * | 6/2006 | Buijsse ................. | 250/396 ML |
| 2006/0076489 A1 | * | 4/2006 | Ohshima et al. ........... | 250/310 |

FOREIGN PATENT DOCUMENTS

JP          01296549 A    * 11/1989

* cited by examiner

*Primary Examiner*—Jack I. Berman
(74) *Attorney, Agent, or Firm*—Shirley L. Church

(57) ABSTRACT

We have developed a particular combination of elements and devices which enables the portability of a scanning electron microscope (SEM). In particular the combination enables a small size, typically less than about 50 liters, a manageable weight, typically less than about 15 kg, and a low power requirement, typically less than about 100 W, which permits operation using power supplied from a portable source such as a battery. Higher performance versions may exhibit increased volume in the range of about 150 liters, increased weight, in the range of 45 kg, and a power requirement in the range of 300 W. The higher performance version of the portable scanning electron microscope may be portable with the assistance of a dolly (rolling cart) or with the assistance of attached wheels and pulling appendage.

19 Claims, 7 Drawing Sheets

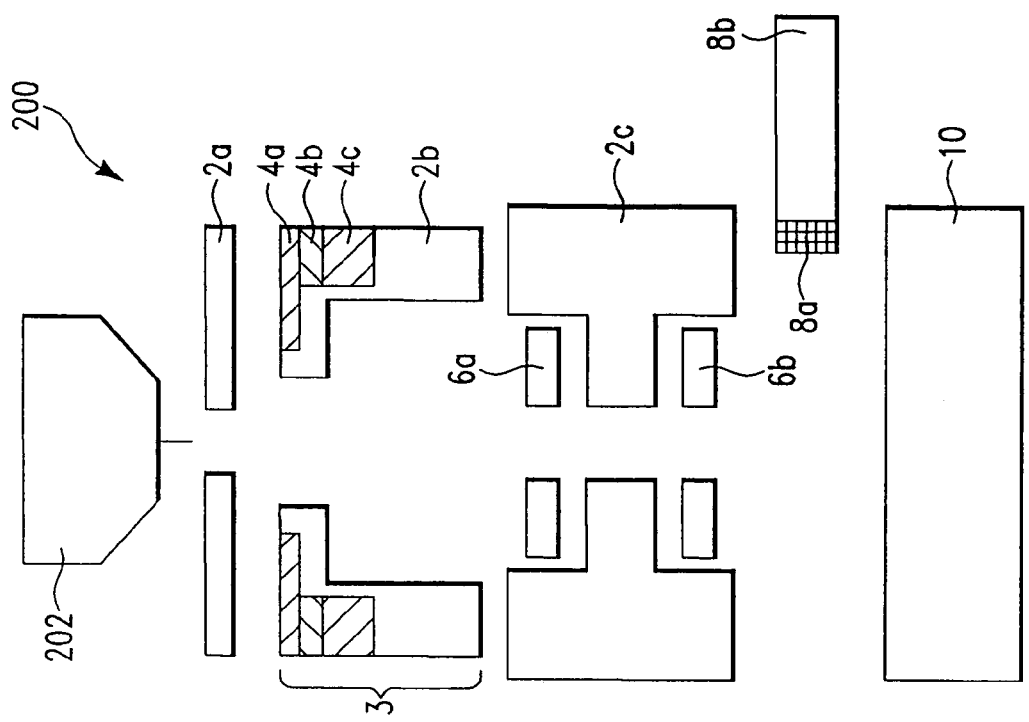
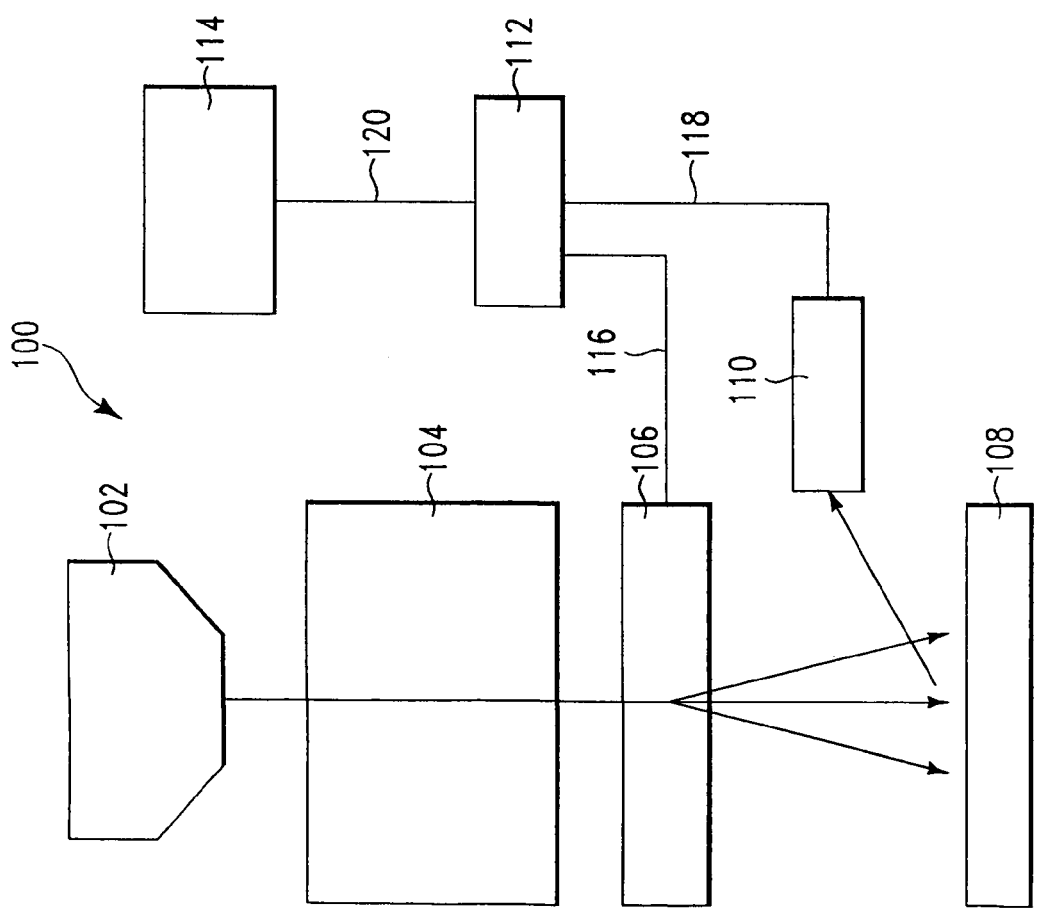

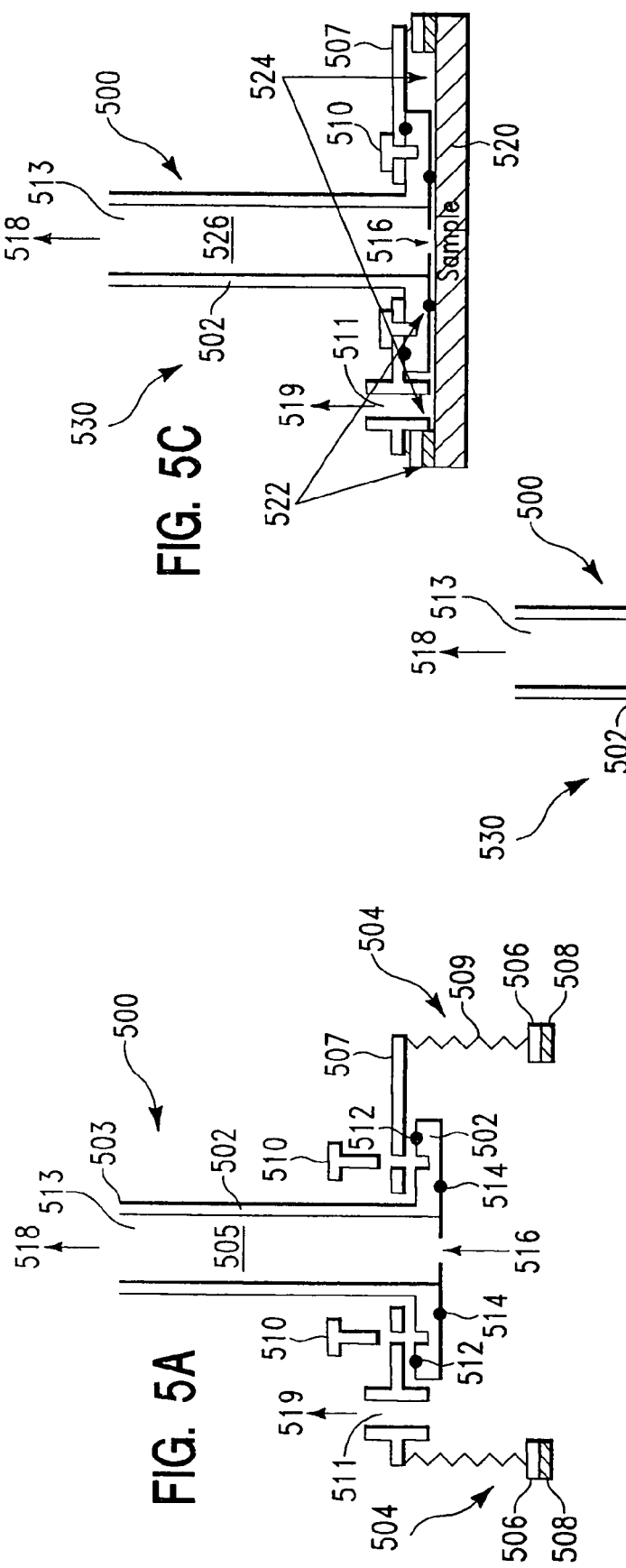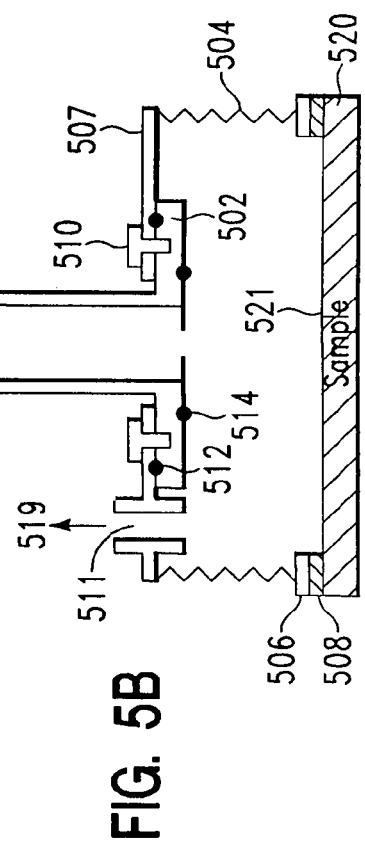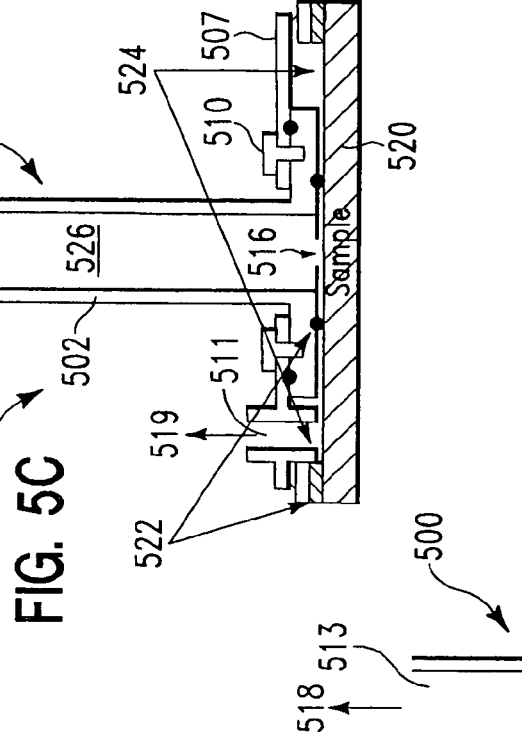
FIG. 5A
FIG. 5B
FIG. 5C

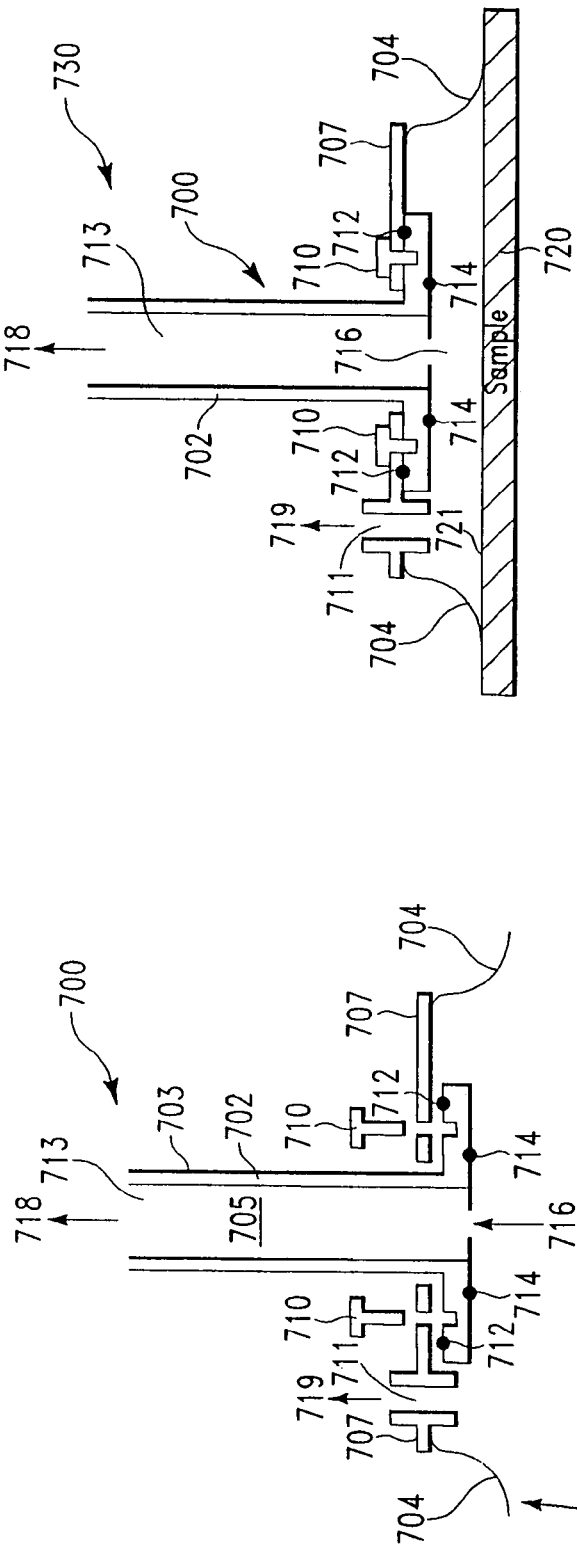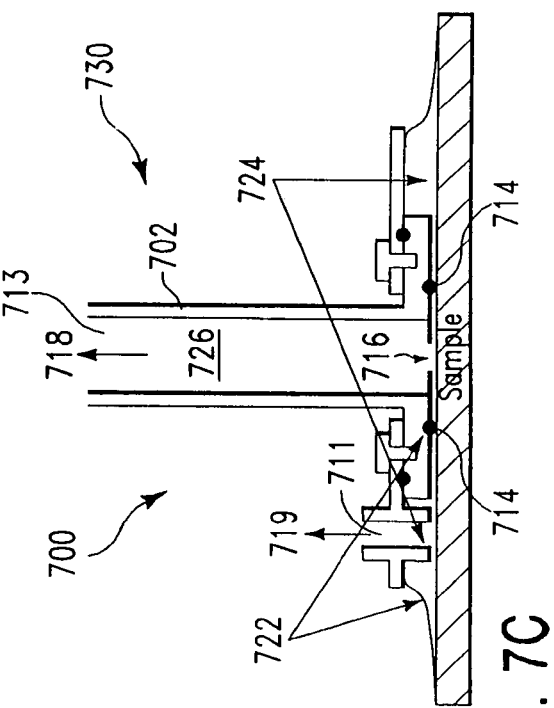
FIG. 7A
FIG. 7B
FIG. 7C

LIGHT WEIGHT PORTABLE SCANNING ELECTRON MICROSCOPE

This application is a continuation application of U.S. application Ser. No. 10/453,117, filed Jun. 2, 2003, which issued as U.S. Pat. No. 6,897,433 on May 24, 2005.

FIELD OF THE INVENTION

In general, the present invention relates to a portable scanning electron microscope which is sufficiently small in size and light weight that it can be transported to and used at locations which have not been possible with present day scanning electron microscopes. Further, the invention enables the inspection of samples which will not fit into a standard vacuum chamber.

BRIEF DESCRIPTION OF THE BACKGROUND ART

The electron microscope was developed to enable imaging of objects and substrates which are too small to be imaged by light microscopes, due to the length of the light wave. The first electron microscopes were developed in the early 1930's and were limited in their resolution by problems such as specimen heating and specimen damage due to high electron energy exposure in general. Considerable work was needed to produce a proper condenser, polepieces for objective and projective, as well as airlocks for specimens and photoplates.

Today, the scanning electron microscope is widely used, mainly for the study of surfaces as well as transparent specimens. Two major applications for the scanning electron microscope are analytical inspection and lithography.

Krans et al., in U.S. Pat. No. 6,218,664 B1, issued Apr. 17, 2001, describe a scanning electron microscope (SEM) provided with an electrostatic objective and an electrical scanning device. The design for the particle-optical apparatus disclosed includes a particle source for producing a primary beam of electrically charged particles which travel along an optical axis of the apparatus towards a substrate/specimen to be irradiated. The primary beam is focused using electrostatic electrodes, to provide a focus point which is in the vicinity of the specimen to be exposed to radiation. A beam deflection system located between the source of the primary beam and the electrostatic electrodes is used to deflect the primary beam so that tile beam can be rapidly scanned over the surface which is to be analyzed. The detection means has a longitudinal axis which is essentially perpendicular to the longitudinal axis of the source of the primary beam, which travels through a bore present in the detection means. The design is said to provide advantages in tents of reducing imaging error regardless of the magnitude of the scanning motion of the primary beam.

U.S. Pat. No. 6,320,194 B1 to Khursheed et al. describes a "portable" high resolution scanning electron microscope column using permanent magnet electron lenses. FIG. 3 in the '194 patent illustrates the SEM column, which includes a condenser lense which provides demagification of the electron beam using two cylindrical shaped permanent magnets. The condenser lense has a center bore for passage of an electron beam from an electron beam gun. Two cylindrical coils are positioned around a pole piece cylinder, through which the primary electron beam passes. Electric current is passed through the coils for the purpose of adjusting the level of demagnification/condensing of the primary electron beam's spot size. The SEM column also includes an objective lens. The objective lens includes a tapered objective lens pole piece structure including a cylinder having a bore through which the electron beam passes. The objective lens is also designed to generate the magnetic field primarily through use of a permanent magnet or magnets which are positioned as far away from the pole piece as is practical. The permanent magnet is used in combination with a tuning coil which is used to adjust the focus of tie beam on the specimen. The description in the Khursheed et al. patent illustrates a compact electron optics, but does not address the mobility of the electron microscope system which is significantly affected by elements other than the electron optics. The mobility of the system as a whole is particularly important for use at locations which are difficult to access.

In an article entitled "Electrostatic einzel lenses with reduced spherical aberration for use in field-emission guns", J. Vac. Sci. Technol. 15 (3), May/June 1978, G. H. N. Riddle describes focusing properties and aberration coefficients for electrostatic einzel lenses suitable for use as preaccelerator lenses in field-emission electron guns. Various lens shapes are analyze(, and asymmetric designs with conical central electrodes are found to have reduced spherical aberration. A lens shape with optimized geometry is found to have a spherical aberration coefficient of less than six times the working distance from the lens to the focal point. The article describes trade-offs between spherical and chromatic aberration, depending on factors such a beam current required, the current/solid angle which is drawn from the emitter, and the voltage spread in the beam. The latter factor is said to depend primarily on emitter temperature, which to a large extent, is determined by vacuum characteristics at the tip of the emitter. Again, this reference focuses on miniaturized electron optics but does not describe an entire system Which is sufficiently mobile to be independently used at locations which are difficult to access.

In a presentation at the 1999 NASA/JPL Workshop on Miniature Vacuum Pump Technology, John L. Callas of the Jet Propulsion Laboratory described capabilities for a scanning electron microscope which might be used to sample and analyze specimens from a surface on the planet Mars. A comparison was made of a system which included emerging microcolumn technology and more standard SEM technology. However, the overall system requirements, such as power supply and pump down requirements for this system were considerably different from the requirements for most applications useful on earth. In addition the sample stage described was inadequate for use in a portable scanning electron microscope.

SUMMARY OF THE INVENTION

We have developed a particular combination of elements and devices which enables the portability of a scanning electron microscope (SEM). In particular the combination enables a small size, typically less than about 50 liters, a manageable weight, typically less than about 15 kg, and a low power requirement, typically less than about 100 W, which permits operation using power supplied from a battery source. Higher performance versions way exhibit increased weight, which is typically less than about 45 kg, and these may be portable with the assistance of a dolly (rolling cart) or with the assistance of attached wheels and pulling appendage.

The portable SEM makes use of low beam energies, in the range of about 1 keV to 10 keV, more typically in the range of about 1 keV to 5 keV, and even more typically within a range of about 1 keV to 3 keV, since this latter range is more advantageous because of smaller size and weight requirements. These low beam energies allow analytical imaging of, for example, dielectrics without charging effects. The low beam energies also reduce damage to biological samples analyzed using the portable scanning electron microscope. The typical magnification of the portable SEM enables imaging of feature sizes as small as about 50 nm for a back pack-sized SEM and about 10 nm for a dolly SEM. This makes the portable SEM useful for analysis of metallurgical grain boundaries.

The basic optical system consists of a source for generating charged particles. These particles are focused onto a specimen by focusing elements and then are deflected by scanning elements. During analysis of a surface, secondary species generated upon contact of the primary charged particles with the contact surface, backscattered species, or a combination thereof are collected by a detector. The scan is generated by a system of electronics that coordinate the generation of the scan signals and the collection of the signal from the detector. The scan is then sent to a user interface.

The charged particles may also be used to do lithography. In this case, the charged particle beam can be placed at a particular, desired location on a substrate surface using software, where a blanker or beam defocus is used while tile beam is moved from one location to another, to expose a resist which is sensitive to charged particles.

The main attributes of the design which enable the portable SEM are: use of a minimum number of focusing elements to reduce the necessary electronics; avoidance of current drawing elements (all elements are permanent magnetic and/or electrostatic) to reduce the size of a portable power source, for example batteries; an electron optical system which is made small, by way of example using micromachined (for example, MEMS) elements, so that the entire optical system exhibits a footprint which is less than about 4 square centimeter, typically less than about 1 square centimeter, and exhibits a length which is less than about 15 centimeters, typically less than about 10 cm. Reduction in the optical system volume reduces the amount of vacuum pumping necessary, thereby reducing both power consumption and vacuum pump size and weight.

The sample may be presented on a sample stage which is a modular unit attached to another module housing the electron optical system. In the alternative, the sample may be a surface to which a suction-sealed housing is attached, with the electron optical system module attached to the suction-sealed housing. When the sample stage modular unit is used, the sample size may be as large as about 3 cm×3 cm, having a thickness up to about 2 cm.

However, when the suction-sealed housing is used, there is no limit on sample size, only a limit on the surface area of the sample which can be viewed at one time. For example, the wing of a Boeing 747 or Airbus 340 could be the sample, and the suction sealed housing could be attached to a point of interest on the wing. The dimensions of the sample which can be analyzed without moving the suction-sealed housing are limited by the maximum scan field of either the electron optics or a mechanical stage which moves the electron column with respect to the suction-sealed housing (rather than moving the sample). The mechanical stage for moving the electron column may be similar to the mechanical stage shown for moving the sample in FIG. 4.

For a portable SEM which can fit into a back pack, the maximum scan field is typically about 1 mm by 1 mm, which can be extended by operation of the mechanical stage to about 3 cm by 3 cm. When the scan field is the same for the dolly SEM as for the back pack SEM, an improvement by a factor of about 25 in the resolution can be achieved for the dolly SEM due to the availability of improved electron optics which is permitted by a size and weight increase. When the suction-sealed housing is attached to a surface of tile sample itself, tile surface roughness and curvature of the surface must be considered in determining the mechanism necessary to seal against the sample surface.

BRIEF DESCRIPTION OF THE DRAWINGS

FIG. 1 shows a cross-sectional schematic of a basic optical system of the kind useful in the portable SEM of the present invention, including but not limited to the primary electron beam source, combination electrostatic/magneto static optics, scanning deflection elements, integrated low-energy secondary and backscattered electron detector, sample stage, vacuum system, and a user interface (display).

FIG. 2 shows a cross-sectional schematic of one embodiment of a basic electron optical system which meets the combinational requirements necessary for a portable SEM.

FIG. 5A shows a basic cross-sectional schematic of a suction-sealing housing which employs a bellows.

FIG. 5B shows the suction-sealing housing of FIG. 5A, sealed against a sample prior to the application of significant vacuum to the interior of the housing.

FIG. 5C shows the suction-sealing housing of FIG. 5A, sealed against a sample after the application of high vacuum to the sample surface.

FIG. 7A shows a basic cross-sectional schematic of a suction-sealing housing which employs a flexible sealing lip.

FIG. 7B shows the suction-sealing housing of FIG. 5A, sealed against a sample prior to the application of significant vacuum to the interior of tile housing.

FIG. 7C shows the suction-sealing housing of FIG. 5A, sealed against a sample after the application of high vacuum to the sample surface.

DETAILED DESCRIPTION OF THE INVENTION

Figure 3A:
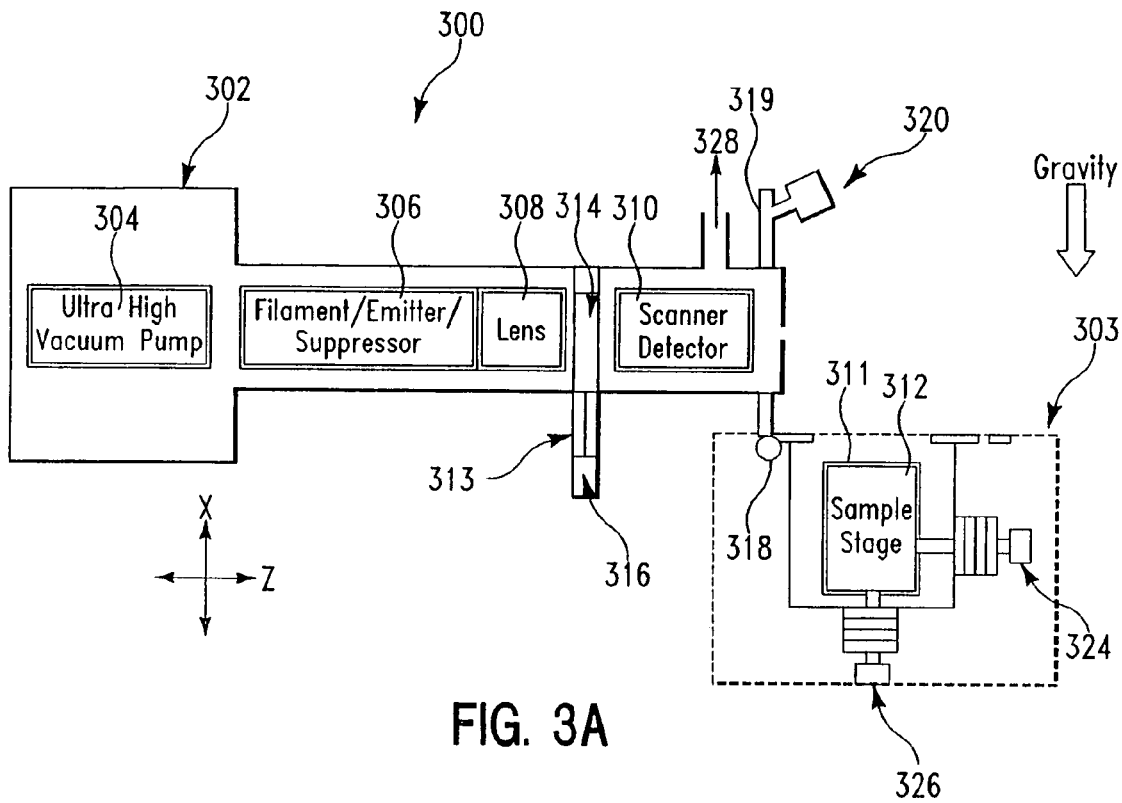
FIG. 3A shows a cross sectional schematic of one embodiment of a portable SEM of the present invention used with a sample stage, where the sample stage is in the open position.

As a preface to the detailed description, it should be noted that, as used in this specification and the appended claims, the singular forms "a", "an", and "the" include plural referents, unless the context clearly dictates otherwise.

As mentioned in the Background Art section above, the present invention pertains to a portable SEM which may either be of a size and weight that it can be carried in a back pack or which may be of a size and weight that can be moved about on a dolly. The dolly-portable SEM may be used for inspection at manufacturing sites where space is constrained or may be loaded into the back of all off road vehicle or pickup trick and taken where needed, provided the landscape topography can be traversed by the dolly. In particular the combination of elements, devices and modules which make up the portable backpack SEM enable a small size, typically less than about 50 liters, a manageable weight, typically less than about 15 kg, and a low power requirement, typically less than about 100 W, which permits operation using power supplied from a battery source. The dolly-portable SEM is capable of providing greater performance, but exhibits somewhat increased size, typically less than about 100 liters, and increased weight, typically less than about 30 kg at a power requirement of about 200 W.

Tile portable SEM makes use of low beam energies, in the range of about 1 keV to 10 keV, more typically in the range of about 1 keV to about 5 keV, with a range of about 1 keV to 3 keV being more advantageous because of smaller size and weight requirements. These low beam energies allow analytical imaging of, for example, dielectrics without charging effects. The low beam energies also reduce damage to biological samples analyzed using the portable scanning electron microscope. The typical magnification of the portable SEM enables imaging of feature sizes as small as about 50 nm for the backpack SEM and about 10 nm for the dolly SEM. This makes the portable SEM useful for analysis of metallurgical grain boundaries.

FIG. 1 shows a basic optical system of the kind which may be used for the portable SEM. The basic optical system 100 comprises a source for generating charged particles 102, which particles are focused onto a specimen 108 via focusing elements 104 and particle deflecting-scanning elements 106. Secondary species which are generated in/at the surface of specimen 108 and backscattered species leave the surface and travel to a detector 110. The surface of specimen 108 is scanned according to a pattern controlled by an electronics system 112 that coordinates the generation of a scan signal 116 to deflecting-scanning elements 106 with the collection of tile signal 118 from the detector 110. The output from the scanning operations is then sent to a user interface 114 which is typically a display.

FIG. 2 shows a cross-sectional schematic of one embodiment of a basic optical system 200 which meets the combinational requirements necessary for a portable SEM. The main attributes of the design which enable the portable SEM are: use of a minimum number of focusing elements to reduce the necessary electronics (especially power supply); avoidance of current drawing elements (all elements are either permanent magnet and/or electrostatic) to reduce the size of the battery source required to power the portable SEM; an electron optical system which is made small, by way of example using MEMS elements, so that the entire optical system typically exhibits a footprint which is less than about 1 square centimeter and less than about 10 cm in length. Reduction in the optical system volume reduces the amount of vacuum pumping necessary, thereby reducing power consumption and size. The basic optical system 200 is a three element charged particle optical system of the kind proposed in the Riddle article which was mentioned in the Background Art. The basic optical system 200 includes a source 202 for generating charged particles, where primary charged species (not shown) are accelerated from a cathode (not shown) within the source 202 by an extraction element 2a. Extraction element 2a is part of a lens 3, where accelerated primary charged species are focused by an asymmetric focusing element 2b and accelerated to their final kinetic energy by an anode 2c. The asymmetric lens design as illustrated by the Riddle article has been shown to form an optical system with minimal chromatic and spherical aberrations. The beam of primary charged species (not shown) is scanned using a post lens electrostatic octopole deflector 6b. Optionally, a pre-correction deflector 6a can be included for centering, astigmatism correction and/or dynamic focus. This allows the scan signals (not shown) and the correction signals (not shown) to be separated. The post lense deflector 6b can be used to make the corrections referred to with deflector 6a; however, this complicates the electronics required to produce the signals. An electrostatic octopole deflector of the kind referred to with respect to the post lense deflector 6b is described in an article by H. S. Gross, F. E. Prins, and D. P. Kern entitled "Fabrication and characterization of an array of miniaturized electrostatic multipoles", Microelectronic Engineering 41/42 (1998) 489–492. The post lense deflector 6b need not be an electrostatic octopole deflector, but may be, for example a twenty pole (icosopole) electrostatic deflector of the kind having 4 signal wires. With the appropriate selection of the electrode widths of tile electrostatic twenty pole deflector, the number of required signal wires can be reduced to four, making this design competitive with the electrostatic octopole. The advantage of the electrostatic twenty pole deflector is that less aberration occurs and only half of the signal wires are required than for the octopole. The disadvantage is that with only 4 signal wires astigmatism correction is no longer possible. An optimized system employs a combination of two deflectors, a pre-correction deflector 6a which is an octopole to correct astigmatism, and a post lense deflector which is a twenty pole beam deflector.

Secondary charged species (not shown) are generated within the surface of specimen 10 in response to the impingement of charged species (not shown). The secondary species generated within the surface of specimen 10 can be accelerated by a collection grid 8a to a detector 8b. The collection grid 8a typically has, for example, a voltage in tile range of −100V to +100V applied. The collection grid 8a either attracts or repels secondary species, depending on the voltage applied, but has very limited effect on primary or backscattered species.

Examples of detectors suitable for this system are scintillation detectors and PIN diode detectors, both of which are commonly available within the art. For example, Hamamatsu Corporation, having offices in Bridgewater, N.J., provides both types of detectors. Suitable sources of charged particles can be obtained from FEI Corporation having offices in Hillsboro, Oreg. or from Denka Corporation, having offices in New York, N.Y. Further additional elements may be obtained from FEI Corporation or from Phillips Electronics, having offices at Sunnyvale, Calif. A roughing (for example, a diaphragm) pump is available from Rietschle Thomas Sheboygan, having offices in Sheboygan, Wis.; a high vacuum (For example, a turbomolecular) pump is available from Pfeiffer Vacuum Technology, having offices in Asslar, Germany; an ultra high vacuum (for example, an ion getter) pump is available from Varian Corporation, having offices in Palo Alto, Calif.; a customized (for electron lenses) high voltage power supply is available from Applied Kilovolts, having offices in Portslade, Sussex, UK; and one recommended embodiment sample stage is available from Thermionics Corporation, having offices in Port Townsend, Wash.

A further enhancement to the design shown in FIG. 2 is to include magnetic elements 4a which are typically composed of a magnetic material embedded into the lense 3 design. A permanent magnet 4b is situated between the elements 4a. This creates a static magnetic focusing element. The electrostatic element 2b then acts as a weak focusing element with the magnetic portion of the lense 3 providing the majority of tile focus.

The main attributes of the electron optical system shown in FIG. 2 which make the design suitable for a portable SEM are: 1) A minimum number of focusing elements, reducing the necessary electronics; 2) No current drawing elements. All of the elements are either permanent magnet and/or electrostatic. The deflection elements are also electrostatic. This reduces the power consumption necessary for operation, thereby reducing the size of any battery operation; 3) The assembly is highly compact. The electron optical system can be made extremely small using either conventional machining or MEMS elements. The entire volume of the electron optical system can be reduced to only a few cubic centimeters. This limits the amount of vacuum pumping necessary, thereby reducing power consumption and size.

The sample to be examined using the portable SEM may be presented on a sample stage which is a modular unit attached to another module housing the electron optical system. In the alternative, the sample may be a surface to which a suction-sealed housing is attached, with the electron optical system module attached to the suction-sealed housing. When the sample stage modular unit is used, the sample size may be about 3 cm×3 cm having a thickness up to about 2 cm.

However, when the suction-sealed housing is used, there is no limit on sample size, only a limit on tile surface area of the sample which can be viewed at one time. For example, the wing of a Boeing 747 or Airbus 340 could be the sample, and the suction-sealed housing could be attached to a point of interest on the wing. The dimensions of the sample which can be analyzed without moving the suction-sealed housing are limited by the maximum scan field of a combination of the electron optics and a mechanical stage which moves the electron column with respect to the suction-sealed housing (rather than moving the sample). The mechanical stage for moving the electron column may be similar to the mechanical stage shown for moving the sample in FIG. 4.

For a portable SEM which can fit into a back pack, the maximum scan field is typically about 1 mm by 1 mm, which can be extended by operation of the mechanical stage to about 3 cm by 3 cm. When the scan field is the same for the dolly SEM as for the back pack SEM, an improvement by a factor of about 25 in the resolution can be achieved for the dolly SEM due to the availability of improved electron optics which is permitted by a size and weight increase. When the suction-sealed housing is attached to a surface of the sample itself, the surface roughness and curvature of the surface must be considered in determining the mechanism necessary to seal against the sample surface.

Figure 3B:
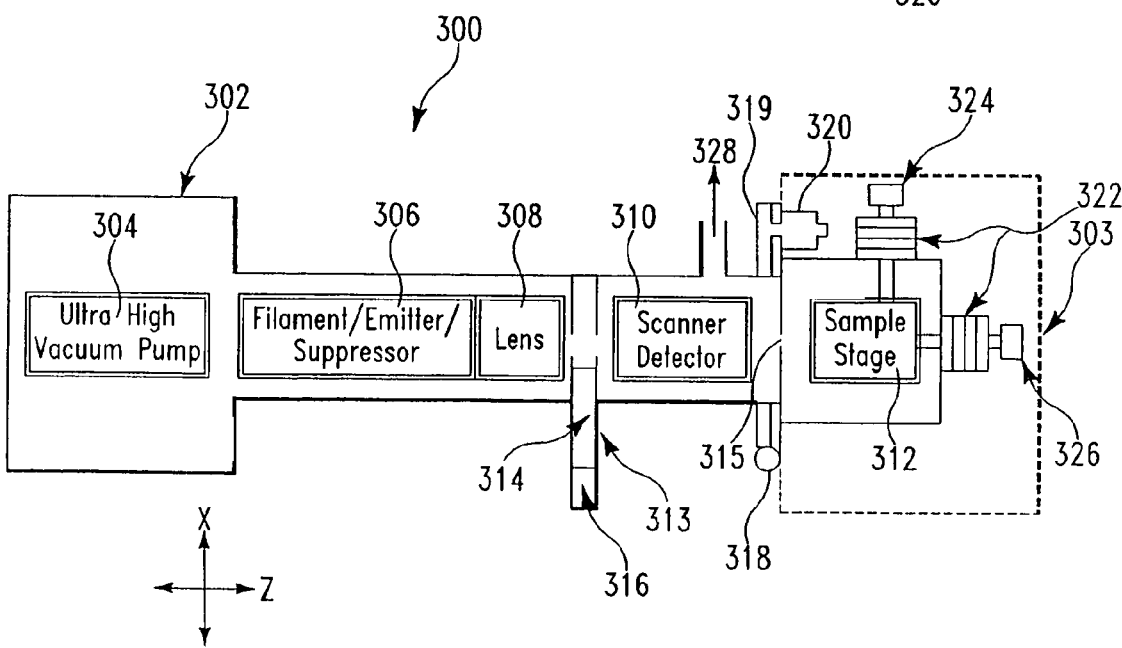
FIG. 3B shows a cross-sectional schematic of the FIG. 3A portable SEM, with the sample stage in the closed position.

FIGS. 3A and 3B show a cross sectional schematic of one embodiment of a portable SEM 300 of the present invention. This embodiment is a "vacuum chamber" concept employing a sample stage which includes a quick access door. The portable SEM 300 includes the vacuum chamber 302 which surrounds the entire SEM 300 when the quick access door 319 is closed. The quick access door 319 and sample stage 303 are shown in the open position in FIG. 3A and in the closed position in FIG. 3B. In the sample-load position, the open position, the sample stage 312 surface 311 which is to contact the sample (not shown) is facing upward and in position for sample loading. In tile sample exposure position, the closed position, the sample stage 312 surface 311 which contacts the sample is facing the scanner/detector 328.

The vacuum chamber 302, as shown in FIG. 3B, encompasses an ultra high vacuum pump 304, a filament/emitter/suppressor 306, a lens 308, a high vacuum valve 313, a scanner/detector 310, and sample stage 312. With reference to FIG. 3B, the sample stage 312 can be moved in the z direction using positioning knob 326 and in the x direction using positioning knob 324. The vacuum chamber 302 is pumped down through outlet (also inlet) 328 by a fore pump (not shown) and a high vacuum pump (not shown). The particular combination of pumps depends on the ultimate vacuum to be achieved. By using a staged combination of a roughening pump and a high vacuum pump, the maximum vacuum obtainable is in the range of about $10^{-6}$ Torr. By using a staged combination of a roughening pump, a high vacuum pump and an ultra high vacuum pump, the maximum vacuum obtainable is in the range of about $10^{-9}$ Torr. Examples of the kinds of pumps which are in the size and weight categories useful in the present invention include, but are not limited to, a roughening diaphragm pump 7106Z available from Rietschle Thomas Sheboygan, Sheboygan, Wis.; a high vacuum turbo molecular pump TPD 011 available from Pfeiffer Vacuum Technology of Asslar, Germany; and an ultra high vacuum miniature ion getter pump available from Varian Corporation of Palo Alto, Calif.

As shown in FIG. 3B, the high vacuum valve 313 is in an open position, and has been opened using a bellows feed through attached to a turning knob or a motor 316 which acts against the spring loading on high vacuum valve 313, which spring loading provides a normally closed position. Mechanical aperture 315 protects the electron optics system. The quick access door 319 is held in locked position by knob 320 which is typically a knurled knob.

The vacuum chamber 302, as shown in FIG. 3A includes the same elements as those shown in FIG. 3B, but is shown with the quick access door 319 open and the sample stage 312 in the loading position. With reference to FIG. 3A, a vacuum which may have been generated during previous operations is released through outlet (also inlet) 328 to permit opening of quick access door 319. The knob 320 has been adjusted to permit opening of the quick access door 319, which opens on hinge 318. When access door 319 is in the open position, the sample stage 312 can be moved in the x direction using positioning knob 326 and in the z direction using positioning knob 324. A sample (not shown) can easily be placed on surface 311 of sample stage 312. The high vacuum valve 313 is in the normally closed position.

Figure 4:
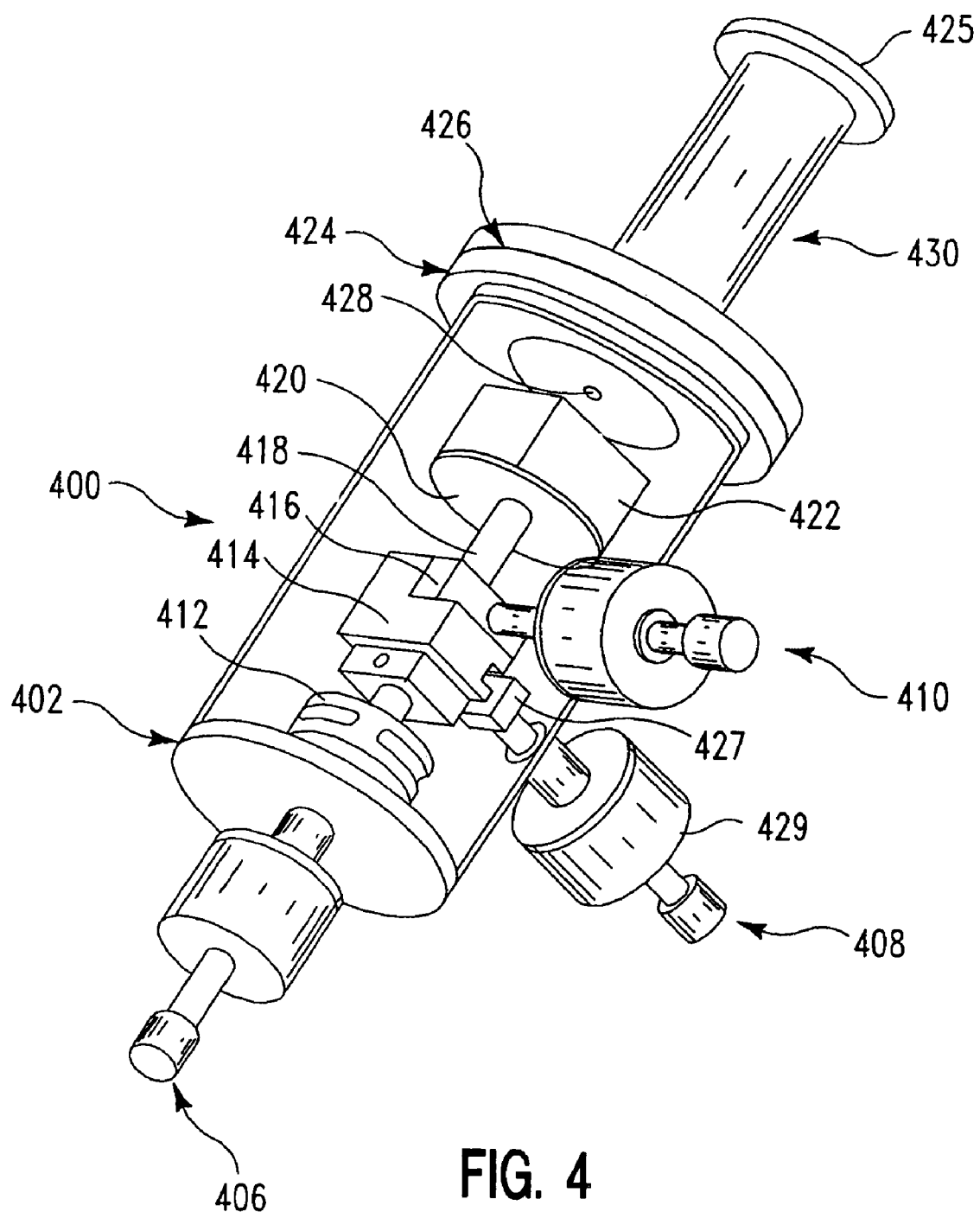
FIG. 4 shows a cross sectional schematic of one embodiment of a sample stage 400 which may be used as part of the portable SEM. The electro optical system is present in the tube/pipe area 430 shown attached to the sample stage 400.

FIG. 4 shows a cross sectional schematic of a second embodiment manual sample stage 400 which may be used as part of the portable SEM. The electron optical system (not shown) is present in the metal tube area 430 shown attached to the sample stage 400. The chamber housing 402 of sample stage 400 typically has an outer diameter in the range of about 6.5 centimeters, although this chamber may be larger depending on other elements used in the SEM. The manual sample stage 400 is designed to be particularly compact and light weight. The sample stage 400 includes an x-axis drive 410, a y-axis drive 408, and a z axis drive 406. The opening to the x-axis drive includes lightweight linear bellows feedthroughs 429 of the kind shown on the y-axis drive 408, each bellows feedthrough having travel capabilities in the range of about ±15 mm. The bellows feed through is a robust and maintenance free feed through device.

The manual sample stage 400 is attached to the metal tube area 430 via a hinge and lock (not shown) which are located at a position 424 where sample stage 400 is attached to metal tube area 430. An O-ring seal 426 is present between sample stage 400 and metal tube area 430. A sample 422 to be scanned is mounted on a mounting plate 420 designed to meet requirements of the particular application of the portable SEM. A plunger 418 is used to move the sample mounting plate 420 along the z-direction. The sample 422 size is typically less than about 3 cm by about 3 cm and less than about 2 cm thick, by way of example and not by way of limitation. Yoke 416 is used to attach a feed through from the x-axis drive 410 to cube 414. A similar yoke is used to attach a feed trough from the y-axis drive 408 to aluminum cube 414. Guide rod 427 from the y axis direction and a similar rod (not shown) from tile x axis direction are used to maintain the sample in a level position with respect to the electron optics. An XYZ spider and hub assembly 412 are used to limit tile travel in the z direction in response to knob 406. Vacuum pump down and release occur through aperture opening 428. Aperture opening 428 also acts to protect the electron optics during operation of the portable SEM. Primary charged species and secondary generated species (not shown) pass through aperture opening 428 from the electron optical system (not shown) present within metal tube area 430. A vacuum pumping system (not shown) is in communication with the opening 425 to metal tube area 430.

FIG. 5A shows a basic cross-sectional schematic of a suction-sealing housing 500 which employs a bellows 504. The suction-sealing housing 500 is used against a surface of a sample or against a platform surface on which a sample is present. The electron optical system used in combination with the suction-sealing housing 500 may be attached to a wall 503 of main housing structure 502 or may be present within an interior 505 of main housing structure 502. Main housing structure 502 is attached to a bellows assembly 504 which includes an upper attachment flange 507, a bellows 509, a bellows footing 506, and a bellows sealing surface 508, which is typically formed from a relatively soft sealing material such as a silicone. The attachment is made using a rigid fastener 510, which may be a machine screw, for example. Sealing structures 512, an O-ring for example, but not by way of limitation, seal the upper attachment flange 507 of bellows assembly 504 against main housing structure 502. Sealing structures 514 seal the main housing structure 502 against the upper surface 521 of sample 520, as shown in FIG. 5C. A low vacuum, in the range of about 2 Torr is pulled 519 through opening 511 in main housing structure 502. A high vacuum, in the range of about $10^{-5}$ Torr is pulled 518 through opening 513 of main housing structure 502. Tile vacuum pumps (not shown) used to produce a low vacuum at outer sealed locations 524 and an high vacuum at inner sealed location 526, as shown in FIG. 5C are of the kind known in the art and are selected to be small in size and light in weight, such as those previously described herein.

FIG. 5B shows the suction sealing housing 500 sealed against upper surface 521 of sample 520 prior to the application of high vacuum to the assembly 530, wherein bellows 504 is not yet fully compressed, and sealing structure 514 is not yet in contact with upper surface 521 of sample 520. FIG. 5C shows the suction sealing housing 500 sealed against the upper surface 521 of sample 520 after the application of high vacuum to the assembly 530, wherein bellows 509 is fully compressed. And sealing structure 514 is sealed against upper surface 521 of sample 520. The pressure within suction sealing housing 500 is staged so that a low vacuum is present at outer locations 524, in the range of about 2 Torr; and, a high vacuum is present at the inner location 526, in the range of about $10^{-5}$ Torr.

Figure 6:
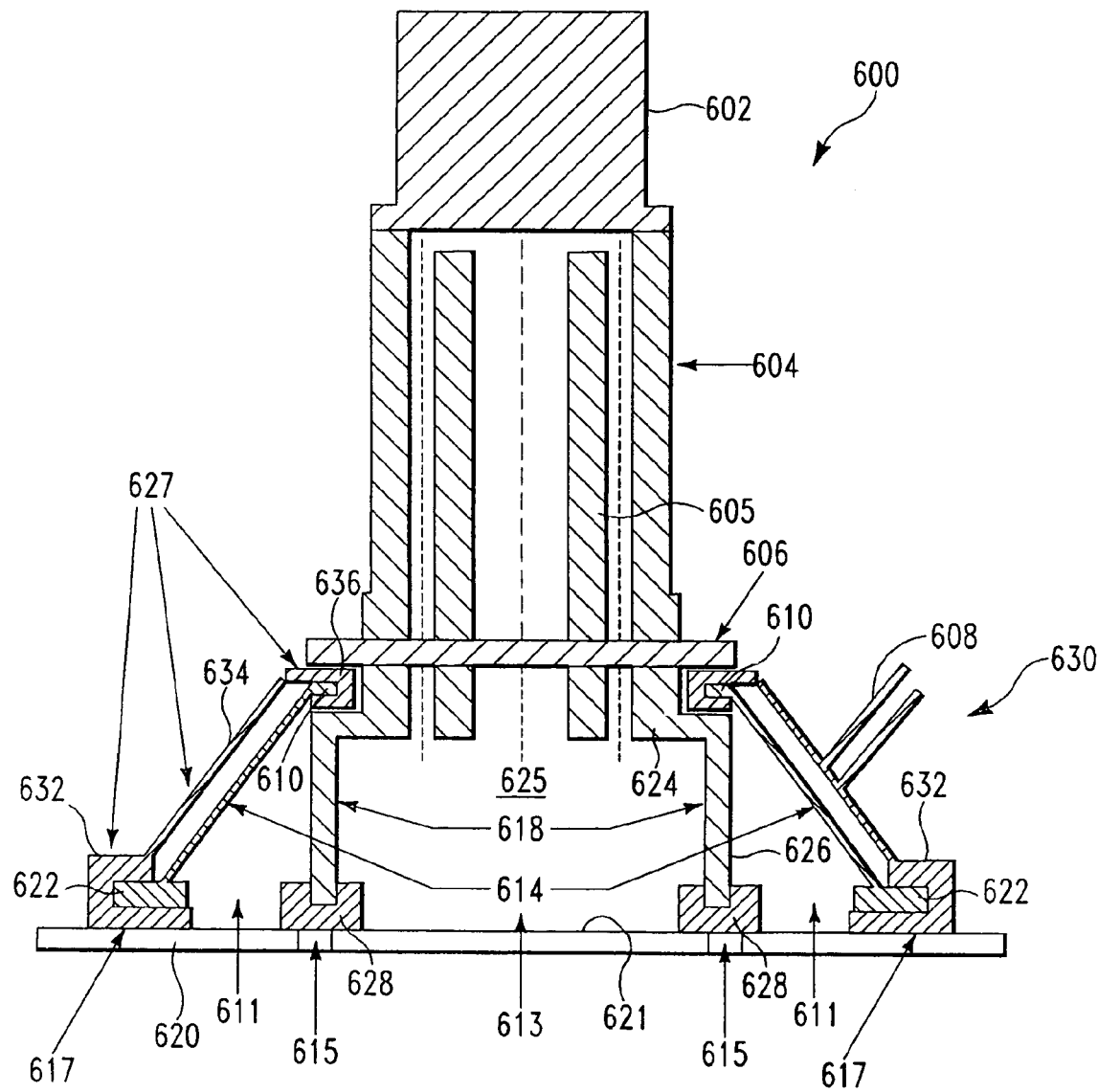
FIG. 6 shows an assembly of one embodiment of a suction-sealing housing which employs a bellows, in combination with SEM elements.

FIG. 6 shows a cross-sectional schematic of one embodiment of an assembly 600 of a suction-sealing housing 630 with attached SEM elements. Assembly 600 includes, not by way of limitation, a second stage vacuum pump which is a high vacuum pump or ultra high vacuum pump 602, which may be a turbo molecular pump, or a combination of a turbo molecular pump with a miniature ion getter pump, respectively. The second stage vacuum pump 602 is sealed against a column tube 604 which provides an exterior housing for electron optics housing 605. Column tube 604 is sealed against a suction-sealing housing 630 via an upper seal 607 secured by a clamping means 606. Suction sealing housing 630 includes, not by way of limitation, an outer sealing surface area 617 and an inner sealing surface area 615 where a seal is created against an upper surface 621 of a sample 620 using a relatively soft material such as a soft VITON®. The outer sealing mechanism includes, but is not limited to, a structure 627 which includes a base sealing structure 632, a flexible ring 634 and an upper sealing stricture 636, all of which are constructed from a flexible material. The base sealing structure 632 and upper sealing structure 636 are preferably constructed from a compressible and tacky material. Interior to structure 627 is a rigid cone-shaped torus 614 having an upper pressure transfer foot 610 and a lower transfer foot 622. Interior to cone-shaped torus 614 is an inner high vacuum chamber 625 which is constructed using, not by way of limitation, an upper sealing housing portion 624 which is in contact with upper seal 607, a stiff bellows 618 which is sealed against upper sealing housing portion 624 and a lower sealing housing portion 626 which is sealed against stiff bellows 618 and which is in contact with a second base sealing structure 628. Upper sealing housing portion 624 and lower sealing housing portion 626 are constructed from a rigid material, while inner second base sealing structure 628 is constructed from a soft sealing material such as the VITON® previously mentioned. The first stage lower vacuum is created between rigid ring 614 and inner high vacuum chamber 625 in the area marked 611 via application of a low vacuum roughing pump (not shown) attached to roughing pump line 608. The second stage high vacuum is created in inner high vacuum chamber 625 in the area marked 613 via application of the vacuum pump 602.

FIGS. 7A–7C show a basic cross-sectional schematic of a suction-sealing housing which employs a flexible sealing lip. The basic structure of the suction-sealing housing is very similar to that shown in FIGS. 5A–5C.

The suction-sealing housing 700 is used against a surface of a sample or against a platform surface on which a sample is present. The electron optical system used in combination with the suction-sealing housing 700 may be attached to a wall 703 of main housing structure 702 or may be present within an interior 705 of main housing structure 702. A flexible seal lip 704 is attached to an attachment flange 707 which is fastened to main housing structure 702 via a fastener 710. Sealing structures 712, an O-ring for example, but not by way of limitation, seal the upper attachment flange 707 against main housing structure 702, as shown in FIGS. 7B and 7C. Sealing structures 714 seal the main housing structure 702 against the upper surface 721 of sample 720, as shown in FIG. 7C. A low vacuum, in the range of about 2 Torr is pulled 719 through opening 711 in main housing structure 702. A high vacuum, in the range of about $10^{-5}$ Torr is pulled 718 through opening 713 of main housing structure 702. The vacuum pumps (not shown) used to produce a low vacuum at outer sealed locations 724 and an high vacuum at inner sealed location 726, as shown in FIG. 7C are of the kind known in the art and are selected to be small in size and light in weight, such as those previously described herein.

FIG. 7B shows the suction-sealing housing 700 sealed against upper surface 721 of sample 720 prior to the application of high vacuum to an assembly 730 which includes the sample surface. FIG. 7C shows the suction sealing housing 700 sealed against the upper surface 721 of sample 720 by contact with flexible seal lip 704 after the application of high vacuum to the assembly 730, where sealing structure 714 is sealed against upper surface 721 of sample 720. The flexible seal lip 704 is typically constructed from a soft material which preferably exhibits a tacky surface. A polysilicone works well for this application. The pressure within suction sealing housing 700 is staged so that a low vacuum is present at outer locations 724, in the range of about 2 Torr; and, a high vacuum is present at the inner location 726, typically in the range of about $10^{-5}$ Torr.

Figure 8:
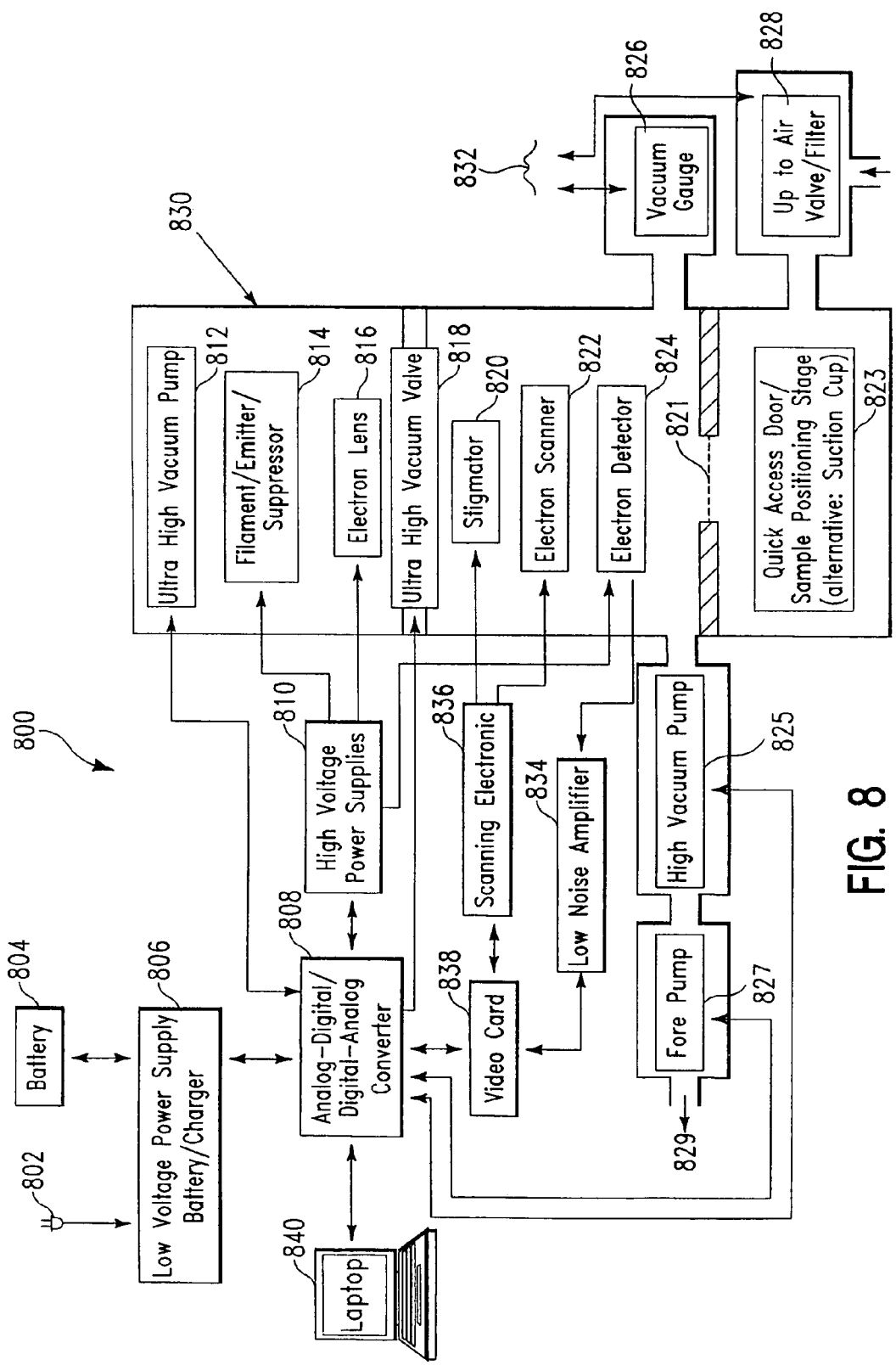
FIG. 8 is a block diagram which shows the various elements of a portable SEM and the manner in which these elements relate to each other.

FIG. 8 is a block diagram 800 which shows the various elements of a portable SEM and the manner in which these elements relate to each other. The basic elements of the portable SEM are shown within a vacuum chamber 830, where the basic elements of the portable SEM include, but are not limited to: an ultra high vacuum pump 812, a filament/emitter/suppressor 814, electron lens 816, ultra high vacuum valve 818, stigmator 820, electron scanner 822, and electron detector 824; vacuum gauge 826, high vacuum pump 825 and fore pump 827 are in communication with vacuum chamber 830 in the manner shown in block diagram 800. An up-to-air valve with filter combination 828 and quick access door/sample positioning stage 823 are also in communication with vacuum chamber 830 through an aperture 821. In this FIG. 8, the up-to-air valve is directly connected to the sample positioning stage, whereas, in FIGS. 3A and 3B, the up-to-air valve is connected indirectly through orifice 328. The power to the system is supplied either via a power source 804 such as a battery, or from an electrical outlet 802, depending on availability. The power is applied to a low voltage power supply (which includes a battery charger) 806 which is controlled by an analog-digital/digital-analog converter 808 which is used in conjunction with numerous other devices as shown on block diagram 800. For example, but not by way of limitation, the analog-digital/digital-analog converter 808 is used in conjunction with a display 840; various high voltage power supplies 810; a video card interface to the display 840; various pumps used in the system such as a fore pump 827, a high vacuum pump 825, the ultra high vacuum pump 812; ultra high vacuum valve 818; and electron detector 824. The video card 838 interfaces with the scanning electronic 836 which is in communication with stigmator 820 and electron scanner 822. Video card 838 also interfaces with low noise amplifier 834 which is in communication with electron detector 824. Signals from video card 838 transmit through the analog-digital/digital-analog converter 808 to display 840, which is typically a laptop computer.

The portable SEM of tile present invention is operated in the manner of existing large scale SEMs and one skilled in the art would be able to operate the portable SEM with minimal experimentation to arrive at appropriate operating conditions for the particular application.

The above described preferred embodiments are not intended to limit the scope of the present invention, as one skilled in the art can, in view of the present disclosure, expand such embodiments to correspond with the subject matter of the invention claimed below.

I claim:

1. A scanning electron microscope, comprising: a volume, including stage with a sealed housing, power supply, and pump down capability in the form of a roughing pump and a high vacuum pump, which is about 150 liters or less; said scanning electron microscope employing one electron emitter, one extractor element which is part of one focusing lens, one scanner, and one detector, and including in the electron optics a combination of elements which include a permanent magnet and an electrostatic element, whereby power consumption is reduced, and wherein the scanning electron microscope operates at a low beam energy ranging from about 1 keV to about 10 keV, and has a power requirement from about 100 W to about 300 W, enabling operation by battery power, wherein the scanning electron microscope has a weight which is less than about 45 kg and is portable.

2. A portable scanning electron microscope in accordance with claim 1, wherein the stage is a manually operated sample stage which is a modular unit attached to the portable scanning electron microscope, wherein the sample stage includes an x-axis drive, a y-axis drive, and a z-axis drive, where the x-axis drive and the y-axis drive each employ a linear bellows feedthrough from a yoke, which yoke is used to manipulate a sample on the sample stage; a plunger which is used to move a plate on which said a sample is mounted along a z-direction; and, guide rods from said x axis direction and said y axis direction to maintain said sample in a level position with respect to electron optics used in conjunction with said sample stage, and wherein said electron optics are in direct communication with said sample staae throuah an aperture opening, whereby said electron optics are protected during a staged vacuum pump down and release which occurs during operation of said portable scanning electron microscope.

3. A sample stage in accordance with claim 2, wherein the sample size may be about 3 cm×3 cm or less and may have a thickness up to about 2 cm, and wherein the sample stage modular unit includes a chamber housing having an equivalent diameter in the range of about 6.5 cm.

4. A portable scanning electron microscope in accordance with claim 1 wherein the volume is less than about 50 liters and the weight is less than about 15 kg, whereby the microscope can be moved by personal handling.

5. A portable scanning electron microscope in accordance with claim 1, wherein the power requirement is less than about 200 W.

6. A portable scanning electron microscope in accordance with claim 5, wherein the power requirement is less than about 100 W.

7. A portable scanning electron microscope in accordance with claim 1, wherein the microscope has a volume of less than about 100 liters and a weight of less than about 30 kg, whereby the microscope can be moved using a dolly.

8. A portable scanning electron microscope in accordance with claim 1 which makes use of beam energies in the range of about 1 keV to 5 keV.

9. A portable scanning electron microscope in accordance with claim 8 which makes use of beam energies in the range of about 1 keV to 3 keV.

10. A portable scanning electron microscope in accordance with claim 7 which provides a resolution enabling imaging of objects which are about 10 nm or larger.

11. A portable scanning electron microscope in accordance with claim 4 which provides a resolution enabling imaging of objects which are about 50 nm or larger.

12. A portable scanning electron microscope in accordance with claim 1, adapted for use in lithographic applications.

13. A scanning electron microscope, comprising: a total volume of the portable scanning electron microscope, including power supply and pump down capability, which is less than about 150 liters, wherein the microscope employs a nominal number of focusing elements to reduce the necessary electronics, wherein said focusing elements consist essentially of one electron emitter, one extractor element which is part of one focusing lens, one scanner and one detector, which focusing elements make use of a combination of electrostatic and permanent magnetic elements within the electron optics, wherein the scanning electron microscope operates at a low beam energy ranging from about 1 keV to about 10 keV, and has a power requirement from about 100 W to about 300 W, whereby the scanning electron microscope may be battery powered, and wherein the microscope employs micromachined elements to reduce the entire optical system footprint to less than about 4 square centimeter and less than about 15 centimeters in length, wherein the scanning electron microscope including all operational elements and power sources weighs less than about 45 kg and is portable.

14. A portable scanning electron microscope in accordance with claim 13, wherein the volume is less than about 50 liters and the weight is less than about 15 kg.

15. A portable scanning electron microscope in accordance with claim 13, wherein the power requirement is less than about 200 W.

16. A portable scanning electron microscope in accordance with claim 15, wherein the power requirement is less than about 100 W.

17. A portable scanning electron microscope in accordance with claim 16 which makes use of beam energies in the range of about 1 keV to 5 keV.

18. A portable scanning electron microscope in accordance with claim 17 which makes use of beam energies in the range of about 1 keV to 3 keV.

19. A portable scanning electron microscope in accordance with claim 13, adapted for use in lithographic applications.

* * * * *